United States Patent [19]
McMeen

[11] Patent Number: 5,433,819
[45] Date of Patent: Jul. 18, 1995

[54] METHOD OF MAKING CIRCUIT BOARDS

[75] Inventor: Mark T. McMeen, Cullman, Ala.

[73] Assignee: Pressac, Inc., Cullman, Ala.

[21] Appl. No.: 67,732

[22] Filed: May 26, 1993

[51] Int. Cl.$^6$ ............................ B44C 1/22; C23F 1/02
[52] U.S. Cl. ........................................ 216/20; 216/48; 216/47; 216/52; 216/105
[58] Field of Search ............... 156/630, 632, 634, 645, 156/656, 659.1, 666, 901, 902; 174/250; 428/901; 29/846, 852; 427/97

[56] References Cited

U.S. PATENT DOCUMENTS 4,610,756 9/1986 Strobel ................................. 156/645
5,220,723 6/1993 Okada ............................. 156/902 X

*Primary Examiner*—William Powell
*Attorney, Agent, or Firm*—Needle & Rosenberg

[57] ABSTRACT

A method of making circuit boards is disclosed that is suitable for use in a high-volume automated processing plant. The method can be used to produce either single-sided or double-sided circuit boards with access windows allowing electrical access and connection between traces from both sides. In the process, access holes are punched in a coverfilm. A copper sheet having a tin plating on one side is laminated to the coverfilm, with the tin side facing the coverfilm. A pattern representing a circuit is screened on the resulting laminate with a UV-curable resist, developed in a UV dryer, and then the unprotected copper is etched away. The remaining tin is then removed with solder stripping agent, and the resulting circuit is protected with a coverfilm. The process can be applied to large rolls of materials in an automated process, with large numbers of circuits applied to the laminated board. The circuits can then be punched out of the web with a hydraulic press in large numbers. The use of two copper sheets and double-sided covering (i.e., having adhesive on both sides) in a slightly modified process permits the efficient manufacture of double-sided circuit boards.

30 Claims, 8 Drawing Sheets

METHOD OF MAKING CIRCUIT BOARDS

BACKGROUND OF THE INVENTION

1. Field of the Invention

This invention relates to a process for making circuit boards and the circuit boards made in accordance therewith, and more particularly to a process for making single-sided or double-sided electrical circuit board with coverfilm or covercoat on either the top side, the bottom side, or both.

2. Description of the Prior Art

Single- and double-sided electrical circuit boards with coverfilm are known in the art. The board material is commercially supplied in a roll with a base film prelaminated to a copper layer without access windows in the film with which to allow contact to the copper from the film side. Circuits are made by screening a positive image onto the polyclad substrate; many separate circuits may be screened on a roll of material. The areas of copper left exposed after screening are etched or plated to reveal a circuit design. Next, access windows and a circuit design are punched out of a base film with adhesive on one side, which is aligned (either manually or with the use of guide pins) over the etched circuit. The coverfilm is then heated to tack the coverfilm to the etched circuit, after which it is fully laminated by running the tacked structure through a nip roll laminator or hydraulic press. Finally, the final circuits are punched out from the reel of material. This process is very labor intensive and is not well-suited to automation.

In addition, the manufacture of double-sided circuit boards of this type allowing electrical connection between traces on one side of an electrical circuit board or single-sided circuit boards having access to the conductive traces from both sides has not been economical. Typically, access windows are opened up in the board substrate by sciving or milling the circuit board containing the finished circuit. This method is, however, a very expensive and time-consuming process requiring precision equipment, and does not lend itself to high-volume production. Alternately, plated-through hole (PTH) technology is used. PTH technology requires that access holes be punched or drilled in double-sided circuit board, and that the holes be deburred. A electroless copper process and optional strike is then done, followed by a screen or photoimage negative pattern. Copper plate is then applied, followed by solder or tin plate, stripping, and etching of the board. A further option of strip solder or tin plate may also be applied, followed by a covercoat or coverfilm application, after which the circuit is punched out. This process is very labor intensive and costly, and does not lend itself to automation without heavy capitalization.

Thus, conventional techniques for making circuit board with coverfilm do not lend themselves to high-volume, automated production, and, without expensive, labor-intensive steps, access to traces on one side of the circuit board is limited only to the side of the circuit board bearing those traces.

SUMMARY OF THE INVENTION

Accordingly, it is an object of this invention to provide a method of manufacturing a single-sided or double-sided electrical circuit board with coverfilm or covercoat on the top and/or bottom side that can be entirely automated except for set-up steps.

It is a further object of this invention to provide a method of inexpensively manufacturing circuit boards capable of having access to traces from both sides of the circuit board.

These and further objects, which will become apparent upon further reading of this specification, are accomplished by a process comprising the steps of:

A. punching at least one access hole in a first coverfilm;

B. applying an adhesive system to a side of the first coverfilm;

C. laminating a copper sheet having a tin coating on one side to the adhesive-coated side of the first coverfilm, wherein the tin coated side of the copper sheet and the adhesive-coated side of the first coverfilm adhere to one another, thereby forming a laminate having a copper side and a first coverfilm side;

D. applying a protective coating over the copper side of the laminate in a pattern corresponding to a circuit, thereby leaving copper to be removed from the laminate exposed;

E. removing the exposed copper, thereby exposing the tin coating under the removed copper, and wherein the protected copper remains adhered to the first coverfilm; and F. stripping the exposed tin coating.

Covercoat is an alternative to coverfilm that uses UV ink to create a covercoat (insulation) over the circuit. This covercoat is achieved by screening UV ink over the circuit board with access windows in the correct location.

Double-sided circuit boards may be made by a slight modification of the above process, as will be apparent from the detailed description below.

DESCRIPTION OF THE PREFERRED EMBODIMENTS

First Preferred Embodiment

Figure 1:
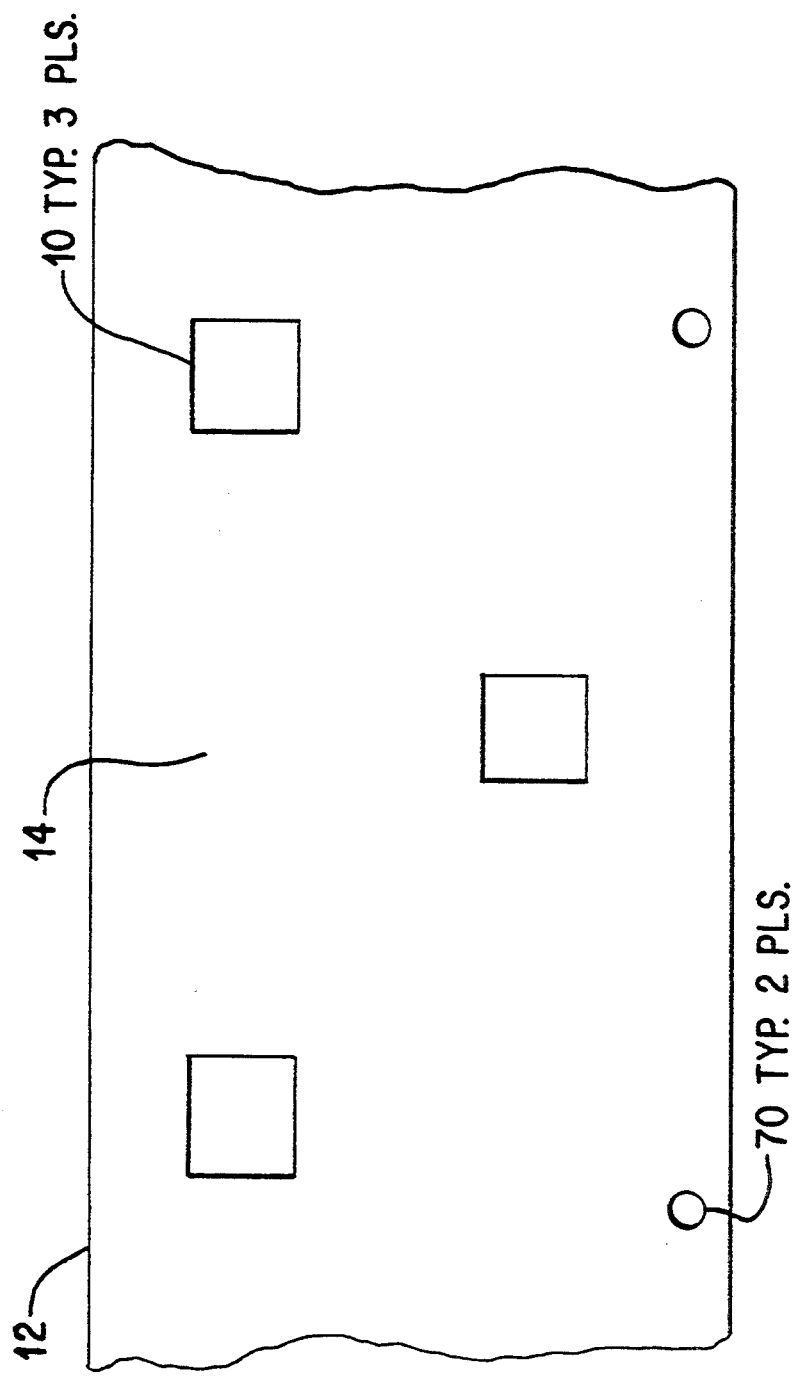
FIG. 1 shows an insulating base material with an adhesive system and access holes punched in accordance with the invention.

The first preferred embodiment of the invention provides a reduced manufacturing cost flexible circuit board having access holes for electrical contact to circuit elements. Referring to FIG. 1, access holes or windows 10 are punched in predetermined locations in a film 12 having an adhesive system 14 on one side. The punching of holes 10 may best be done using a hydraulic press. After punching, the film 12, which is advantageously supplied in roll form, may be rewound on the same or a different spool. The film 12 may be comprised of polyester or polyester-based material, or a polyimid material, such as those sold under the trademarks Kapton or Upilex. Thicknesses of 0.001 inch to 0.005 inch are preferred, although the precise thickness of film 12 is not critical to the invention. Other thicknesses of film 12 that can be readily punched, rolled, and laminated may also be used. The adhesive system 14 may be polyester- or acrylic-based, with the former preferred for standard polyester and polyester-based film 12 and the latter preferred for polyimid-based film 12. Epoxy-based adhesive systems 14 may also be suitable, and should work for both polyimid and polyester films 12.

Figure 2:
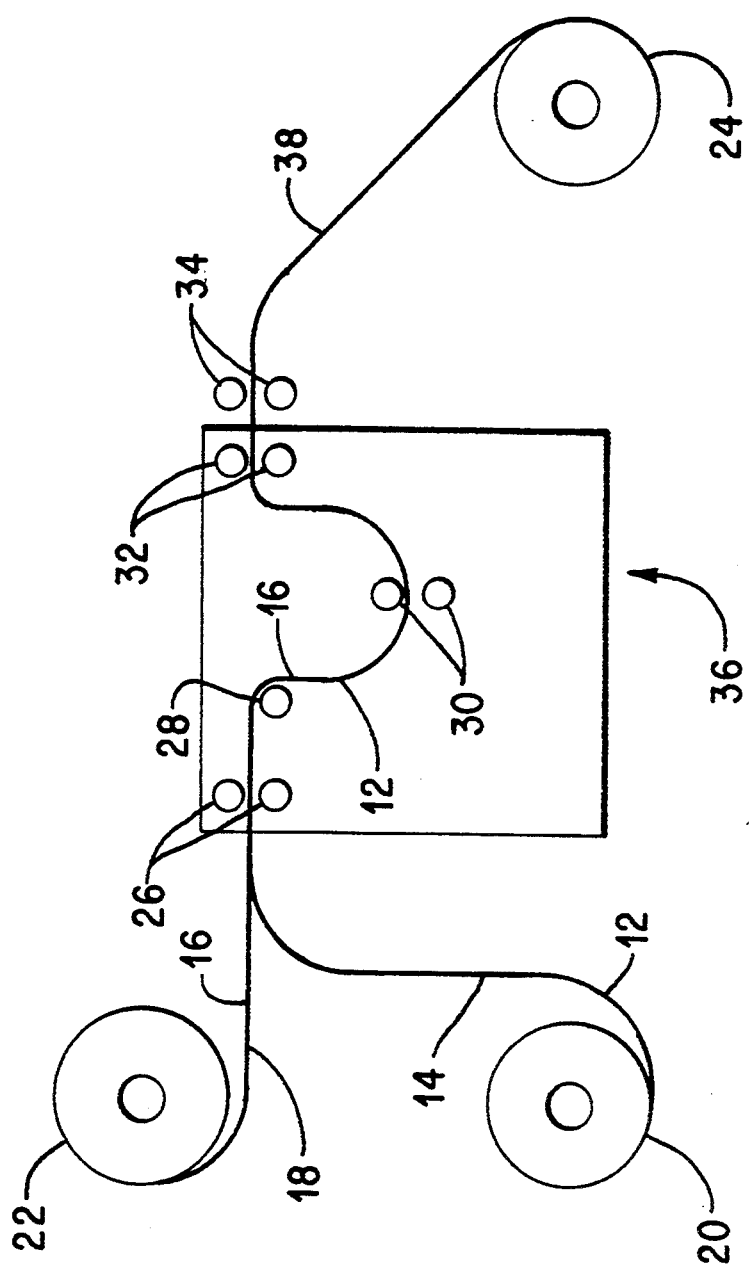
FIG. 2 shows an illustrative method for preparing a laminated circuit.

After access holes 10 are punched, film 12 is laminated to a tin-coated copper sheet 16, shown in FIG. 2, with the tin side 18 facing the adhesive side 14 of film 12. One or two ounce copper sheet 16 having a 0.00005 inch (min.) thick tin plate coating 18 on one side is suitable for this use. The exact weight of copper sheet is not critical; weights from about ½ ounce to about 5 ounce are suitable, and may be chosen based upon requirements such as durability, flexibility, and current-carrying capacity. Such weights are quite easily handled and the resulting laminate 38 is easily rolled. The minimum thickness of the tin coating 18 is selected to survive the etching process described below. A thickness of about 0.00005 inch is a minimum preferred thickness for 1 to 2 oz. copper, while for 2 to 5 oz. copper, a thickness of 0.0005 inch is adequate. Thicknesses as great as about 0.00150 inch may be used for tin coating 18 with the tin stripping process described below.

Lamination is preferably performed using a hot roll nip laminator 36. This laminator receives the copper sheet 16 from one roll 22 (unwind unit) and the punched insulating film 12 from another roll 20 (unwind unit). Roll 20 may also contain unpunched insulating film 12, if the punching of holes 10 (not shown in FIG. 2) is done as film 12 is unwound from roll 20, prior to the film 12 entering the laminator 36. Copper sheet 16 and insulating sheet 12 are joined as they enter the nip roll laminator 36, with the tinned side 18 of copper sheet 16 facing the adhesive side 14 of insulating sheet 12. The sheets are preheated by rollers 26. The sheets then pass over alignment roller 28, and are pressed together by hot pressure rollers 30. After passing through cool-down rollers 32 and alignment and exit rollers 34, the resulting laminated sheet 38 exits the laminator and may temporarily be spooled into another roll 24 for further processing, or may be further processed in accordance with the invention as it leaves laminator 36.

Figure 3:
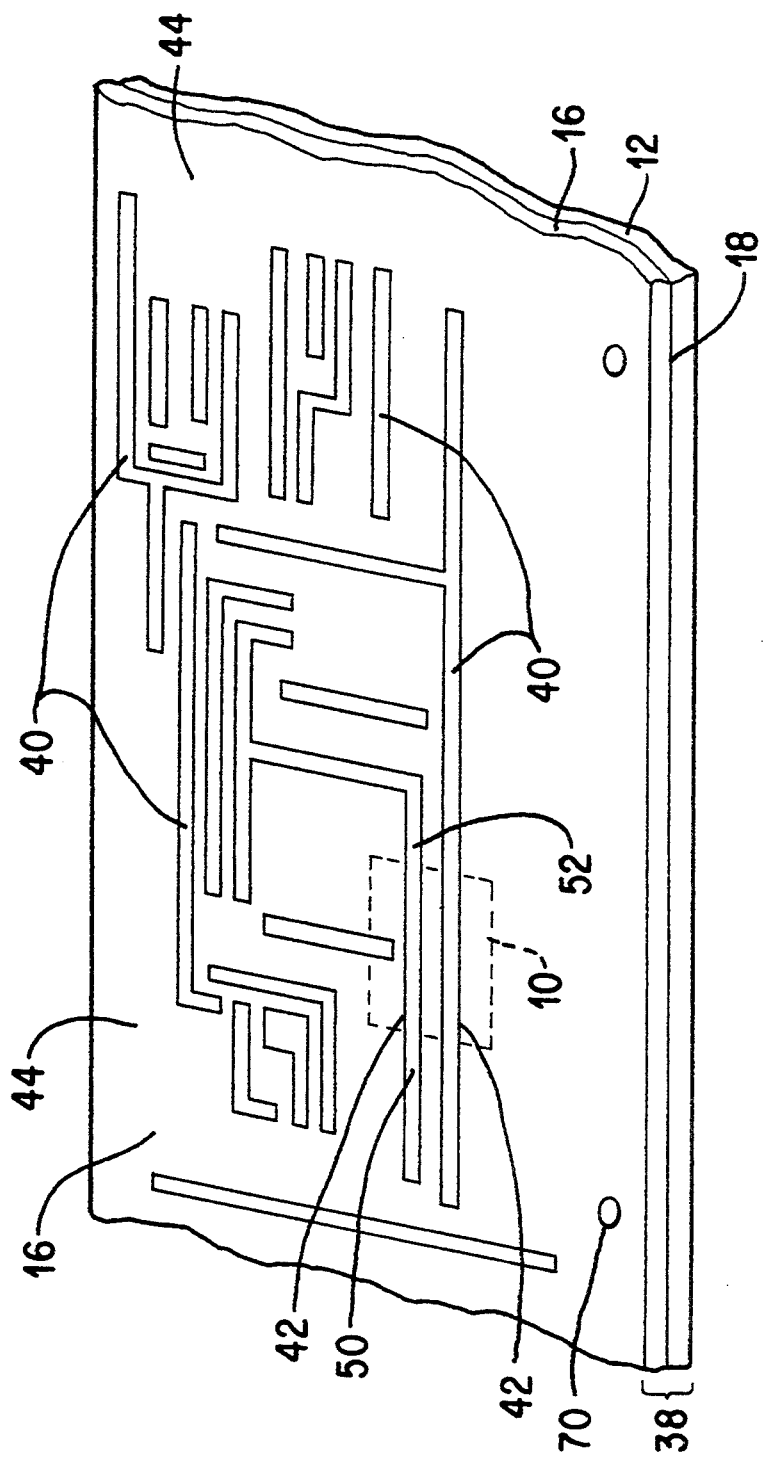
FIG. 3 shows one embodiment of a portion of a circuit in preparation in accordance with the invention prior to the etching of exposed copper.

A positive image 40 corresponding to the pattern of copper from the copper sheet 16 to remain after etching is then silkscreened on the copper side 16 of the laminate 38, as shown in FIG. 3, using a UV ink or etch-resistant paint or coating, such as that sold under the trademark LeaRonal-Ronascreen 1400 B. Silkscreened image 40 on laminate 38 is then dried in a UV dryer. Other types of etch-resistant inks and paints may be used, or a photoimaging process may be used to produce positive image 40. However, the use of a silk-screened UV-curable ink or paint resist is preferred, because the silkscreening process can be readily adapted to automation and the production of rolls of circuit board material, and UV inks and paints can be rapidly cured without heat in a UV dryer. The positive image 40 applied to the copper side 16 of the laminate 38 corresponds to a (usually large) number of (separate) circuits which will later be punched out of laminate 38 at the completion of the process. The positive image 40 is aligned with the holes 10 in the film layer 12 of substrate 38 so that predetermined portions 42 of the image 40 are applied to portions of the tin-coated copper sheet 16 covering the holes 10; this will result in corresponding portions of the copper sheet 16 being left unetched over the holes 10. Alignment is accomplished by using punched target holes 70 in substrate 12. (Normally, the copper sheet 16 will not cover the alignment hole targets 70 in substrate 12. Target holes may also be used to facilitate automated handling of the materials as they are processed.) Any desired pattern may be left over the holes 10, except, of course, unsupported islands. Preferably, traces are designed to traverse hole 10 and be supported in at least two places, e.g., 50 and 52, as shown in FIG. 3, or an entire hole may be covered by a sufficiently wide copper trace.

Figure 4:
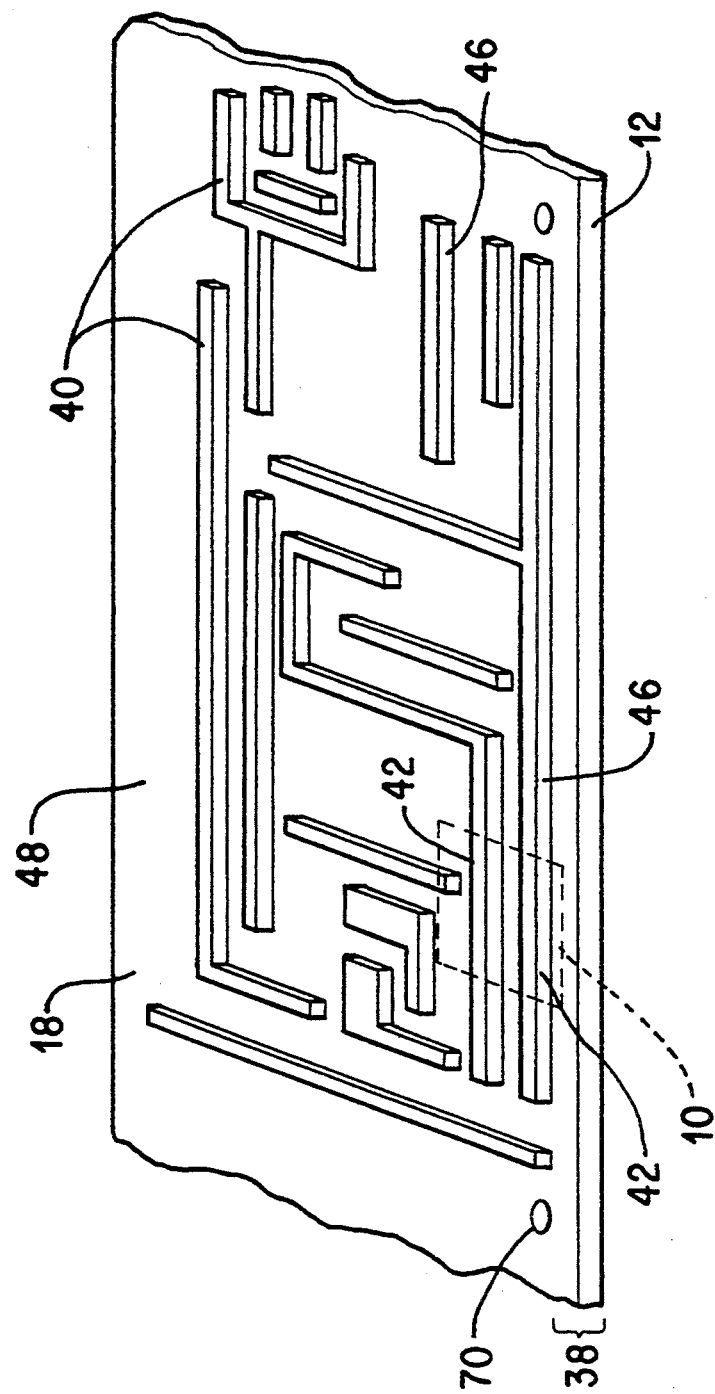
FIG. 4 shows the embodiment of FIG. 3 after the etching of exposed copper.

After the image 40 is screened onto the copper side 16 of laminate 38, an ammoniacal etchant (such as that sold under the trademark UltraEtch 50 by McDermid) is used to remove exposed copper 44 from the copper sheet 16 laminated to the base film 12. As shown in FIG. 4, etching leaves the protected copper 46 in the area corresponding to the desired circuit outline. After etching, the screened image 40 may be removed. Although exposed copper 44 is etched away, the tin plating 18 is not dissolved, and remains laminated to the base film 12. The exposed parts 48 of the tin plating 18 not covered by the protected copper 46 must be removed to make the final circuit board. Therefore, after etching, a tin stripper (such as that sold under the trademark Shipley Solder Stripper 603) is applied to remove the exposed tin 48 by chemical dissolution, including tin covering copper that remains over holes 10. The remaining copper 46, which was protected by the screened image 40 (which may be removed after the etching of the copper), comprises the circuits that will later be punched out of laminate 38. Advantageously, traces of copper covering holes 10 are electrically and physically accessible from both sides of the laminate 38.

Figure 5:
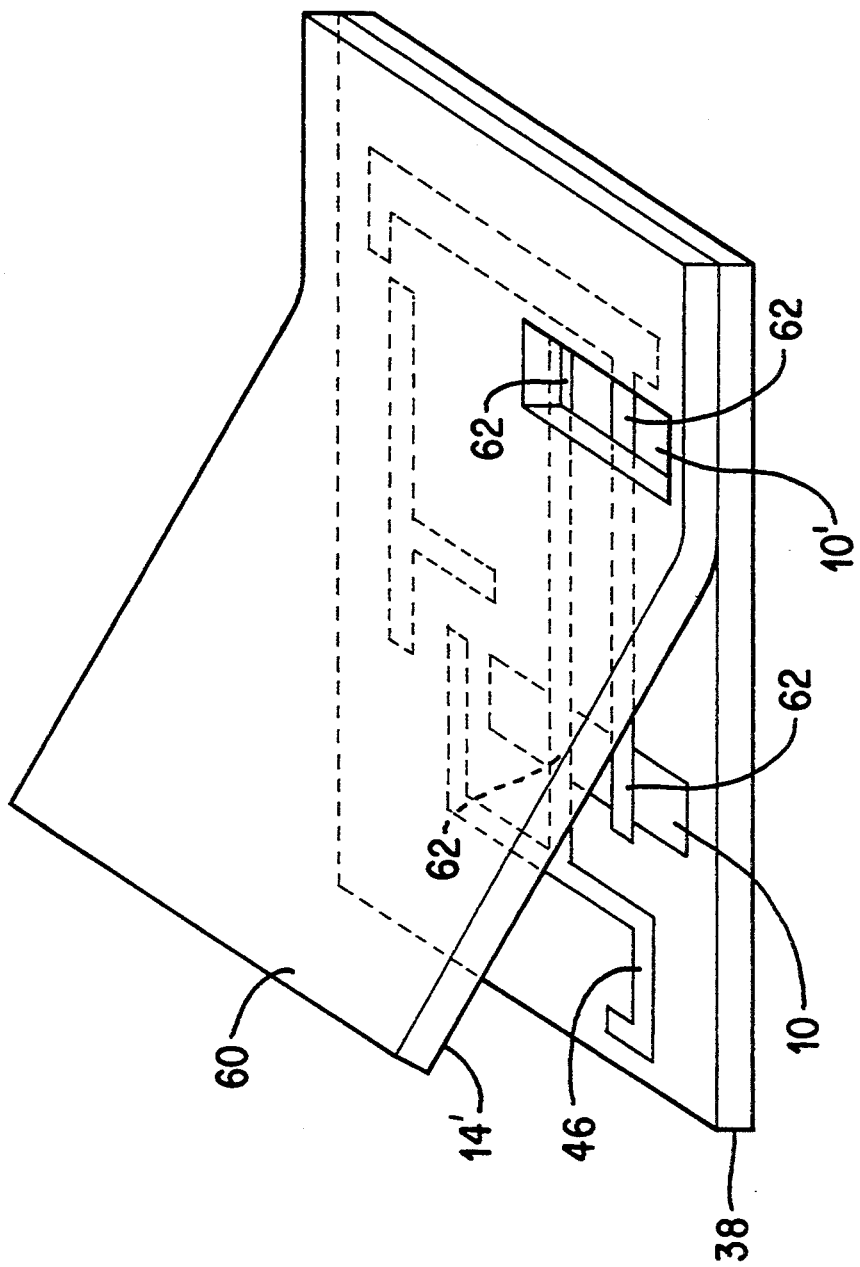
FIG. 5 shows portions of copper circuit exposed through holes in a circuit made according to the invention.

If desired, the laminate 38 may be left uncovered and unprotected, or, as shown in FIG. 5, a protective cover-film 60 may be applied to the laminate 38 for protection of the copper circuit 46. (Although not shown, a protective covercoat may optionally be used instead of, or in addition to, the protective coverfilm 60.) Electronic components may be attached to the circuit board by mechanically crimped contacts through the coverfilm, or by soldering or by pressure contacts through holes in the coverfilm. Protective coverfilm 60 may comprise another layer of polyester, Kapton or Upilex having an adhesive coating 14' on one side. Standard cut and tack methods may be used, and a hot roll nip laminator such as that used in the preceding lamination step may be used for laminating the coverfilm 60, with the adhesive coating 14' on the coverfilm 60 facing the copper circuit 46 side of the laminate 38 during lamination. Coverfilm 60 may, if desired, have additional holes 10' through which physical and electrical contact with the copper circuit 46 may be made. Although not shown in FIG. 5, holes 10' may optionally be aligned with the holes 10 in layer 12 to provide access to the same portion of the circuit from either side of the circuit board. Alternately, a covercoat may be applied instead. The covercoat is preferably a UV covercoat, which has the advantage that it is usually less expensive than a coverfilm to apply, and can be quickly cured by UV light without heat. The covercoat may be applied by any suitable method, such as spraying, screening, or painting, and should cover all of the unetched copper 46 except where electrical access is desired; i.e., where access windows are desired, the unetched copper should not be covered with the covercoat. The final circuits may then be blanked out from the web (i.e., the substrate) using a suitable tool, such as a hydraulic press.

As can readily be seen in FIG. 5, the portions 62 of the copper circuit 46 exposed through any of holes 10 and 10' may be accessed through those holes, and connection may be made to them by any suitable method for making an electrical connection to a correspondingly thin copper strip. Examples of such methods include any of the various soldering techniques and other thermal bonding methods, the application of conductive ink or paste, or the use of physical force or pressure, such as by springs or clamps.

Second Preferred Embodiment

Figure 6:
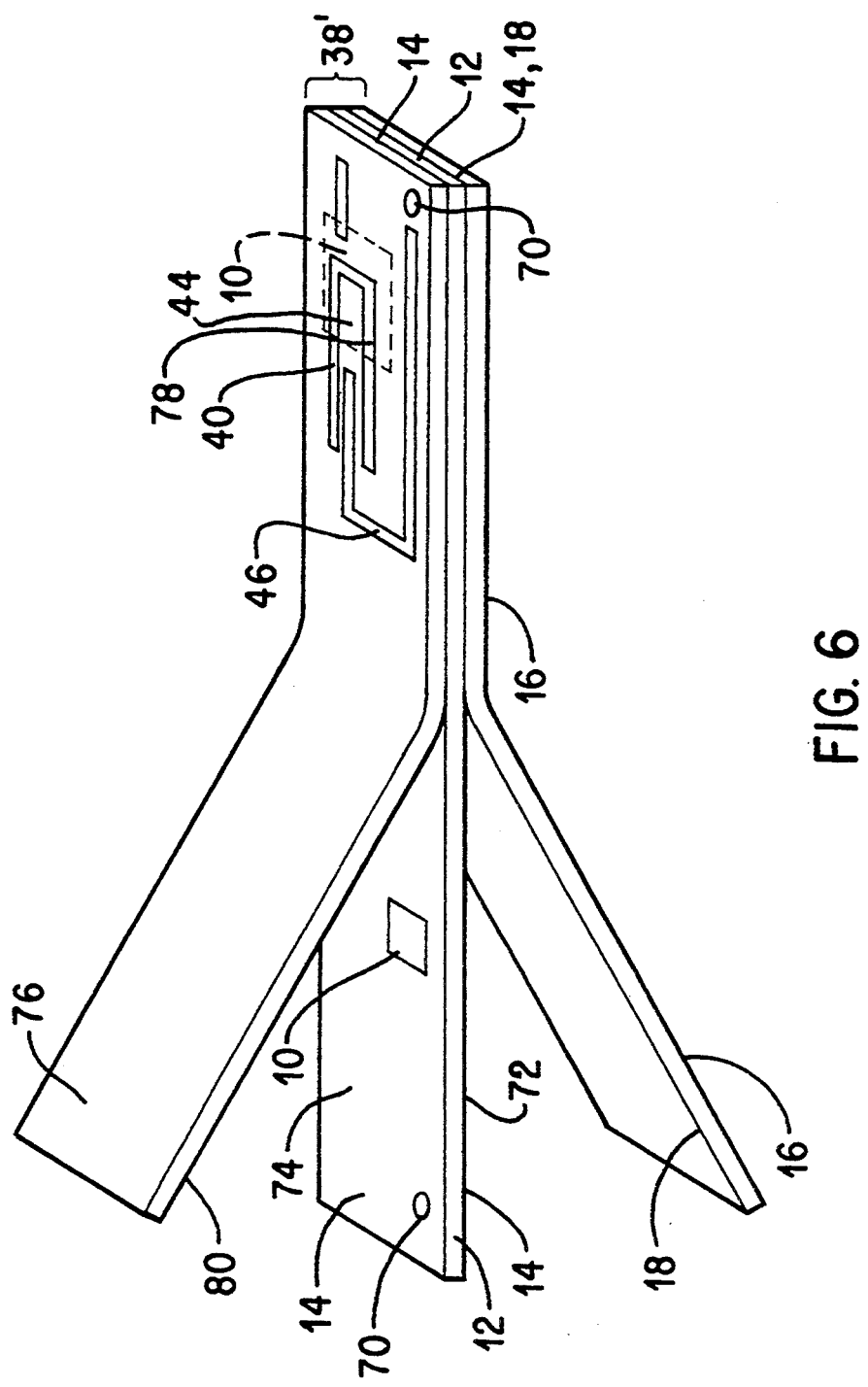
FIG. 6 shows a schematic representation of another embodiment of the invention having two copper layers, one on each side of the insulating layer.

In a second embodiment using the same or similar raw materials as the first embodiment, a reduced manufacturing cost double-sided flexible circuit board having top side access is created, providing for tin-coated copper circuit with and/or without interconnections. As in the first embodiment shown in FIG. 1, access holes or windows 10 are punched in a base film 12 in a reel-to-reel process. However, unlike the first embodiment, an adhesive system 14 is placed on both sides of the base film. Alternately, the adhesive system may be applied before the windows 10 are punched or a precoated sheet may be used. The films and adhesives used in this embodiment may be the same as those described for use in the first embodiment. During the hole punching step, tooling and registration holes 70 are also punched in the base film 12. Turning now to FIG. 6, a sheet of copper 16 having a tin coating 18 on one side (as in the first embodiment) is then laminated, tinned side 18 towards the base film 12, onto one side 72 of the base film 12, and a sheet of uncoated copper 76 is laminated to the other side 74. Lamination is preferably done with a hot roll nip laminator, similarly to the two-layer lamination shown in FIG. 2, but using a laminator adapted to laminate the three layers 12, 16, and 76 of this embodiment. (The copper sheets 16 and 76 may also have tooling and registration holes 70, as shown at the right of FIG. 6, or more preferably, the copper sheets 16 and 76 should be somewhat narrower than the base film 12 and thus not cover the registration holes 70 in the base film after lamination.) The top face of copper sheet 76, which forms the top of laminate 38', can then be photoimaged or more preferably screened with a positive image of the circuits to be produced as in the first embodiment. The copper 16 on the bottom side of laminate 38' is similarly screened or photoimaged with another positive image (not shown in FIG. 6) which is generally different from the image 40, but is in relationship therewith in accordance with the desired circuit design. Screening of both sides with a UV photoresist is preferred, because the screening process can be done at high speed, and the UV photoresist can be developed quickly with UV light and without heat.

An ammoniacal etchant (such as that sold under the trademark Macdermid Ultraetch 50) is then used to dissolve exposed copper 44, thus outlining the circuit design on both sides. The etching of both sides of the substrate 38' is preferably accomplished by spraying the etchant onto both sides. The two copper layers 16 and 76 can thus etch simultaneously, thereby saving time and processing steps, even as the etching of each side proceeds independently. The tin coating 18 on copper sheet 16 prevents the etchant from etching through the holes 10 in the nonconductive film 12, as this layer of tin 18 is not attacked by the etchant. The other layer of copper 76 does not have this tin coating, however. Depending upon the location of the holes 10 in the nonconducting film 12 and the photoresist pattern 40 on copper sheet 76, portions 78 of the layer 76 overlying one or more holes 10 in the nonconductive film 12 may be etched away. Underside 18 of the copper 16 will be exposed through access window 10. As will readily be appreciated by those skilled in the art, however, the speed of the etchant and the length of time the etchant is allowed to remain in contact with the copper can be controlled. Thus, it is relatively simple to formulate concentrations and timings to avoid attacking the underside 18 of copper sheet 16 that are over the holes 10 in the nonconductive layer 12. After etching, the photoresist pattern 40 may be removed.

As in the first embodiment, a UV covercoat, such as that sold under the trademark LeaRenal Renascreen 1301 G UV Solder Mask, may optionally be screened to one or both sides of the laminate 38' for physical protection and electrical insulation of the circuits 46 on either or both sides of the laminate 38'. Alternately (or optionally, in addition to the covercoat), coverfilm may be applied to one or both sides using a standard cut and tack method. In either case, access windows may optionally be used in the protective coating to allow direct physical and electrical contact with the circuits 46 if desired. The final circuits are punched out of the reel of etched laminate material 38' using standard equipment such as a hydraulic press and die sets.

Figure 8A:
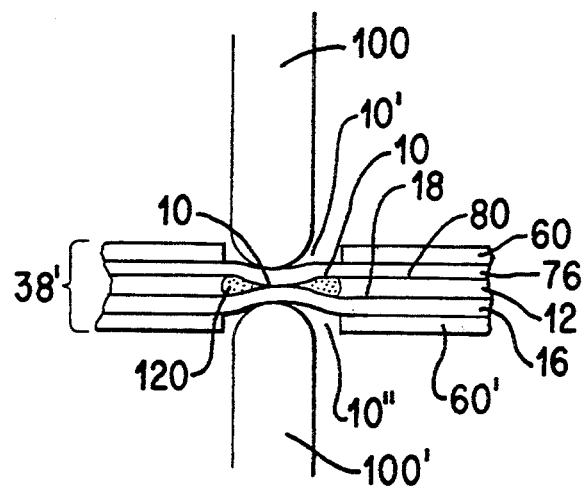
FIGS. 8(a), 8(b), 8(c), and 8(d) show methods of interconnecting layers of a two-layer circuit board according to the invention.
Figure 8B:
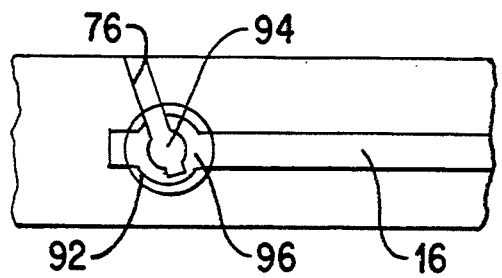
Figure 8C:
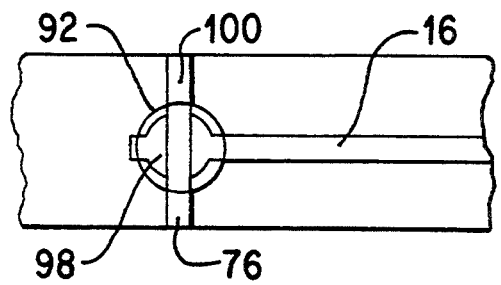
Figure 8D:
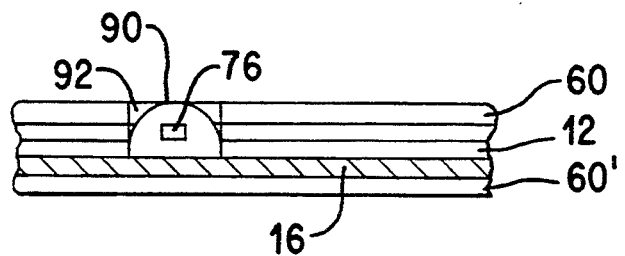

Interconnects may be added to the punched-out circuits if desired, by the standard method of screening conductive ink or epoxy 90 onto prepunched areas 10' of the protective coverfilm (or covercoat) layer 60 overlying punched holes 10 in the base layer 12 (and thereby forming a cavity 92) to make an electrical interconnection between layers 76 and 16 as shown in FIG. 8(d). Alternately, roll solder and wave solder may be used in the pre-punched cavity 92 to make electrical interconnections. Hand soldering in pre-punched cavities 92 is also possible, although not usually cost effective. In addition, a hot pin bonding method shown in FIG. 8(a) may be used to thermally bond copper materials in the access windows. In this method, the tin coating 18 of copper sheet 16 must face an access window 10 to allow contact to the side 80 of layer 76. Heat is applied by heating means 100, 100' from the opposite sides of the laminate 38' through holes 10', 10'' in cover sheets 60, 60', the opposing copper areas from layers 16 and 76 are heated to 780° F., and tin 120 is reflowed to create an electrical bond. As yet another method for creating an electrical contact, electrical contact may be made between conductors on either side of the board simply by crimping a mechanical splice through the circuit board.

Typically, cavities 92 may be used to make connections from a pad 94 in layer 76 to a pad 96 in layer 16, as shown in FIG. 8(b) or from a pad 98 to a conductor 100 in the different layers 16 and 76 as shown in FIG. 8(c).

Figure 7:
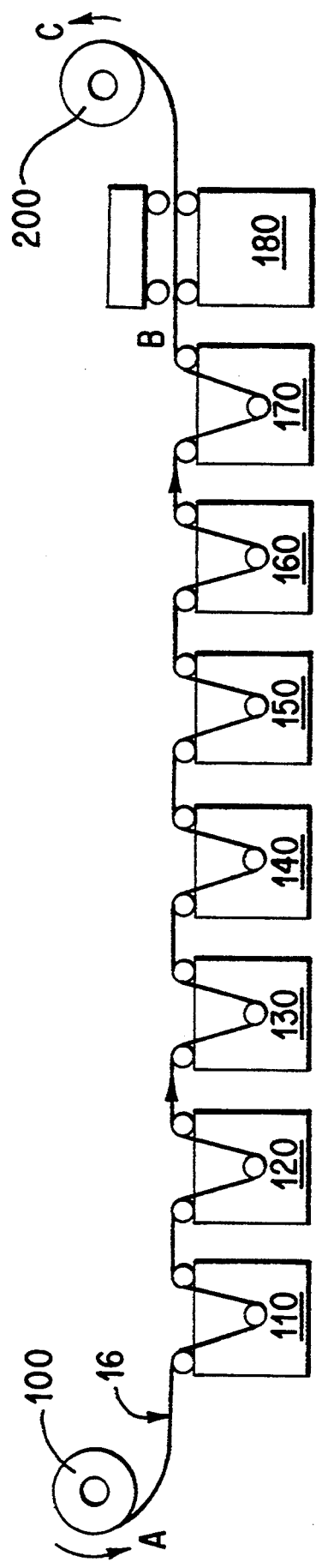
FIG. 7 shows a process suitable for preparing a copper sheet with one side tin-plated for use in preparing circuits in accordance with the invention.

A Process for Preparing Tin-Plated Copper Suitable for Use in the Three Embodiments Referring now to FIG. 7, a suitable process for tin-plating the copper sheet 16 to be used in the three preferred embodiments starts with a reel 100 of copper sheet 16 (preferably 1 oz. sheet as noted above). The surface to be plated is pre-cleaned in a bath 110 and rinsed in a water bath 120 to remove oil and other matter. A mild soap, such as Shipley 1110A is suitable for the pre-clean. The surface is then microetched, preferably using a solution of sodium persulfate or sulfuric peroxide 130, and then rinsed again in a second water bath 140 to prepare a surface to be bonded with tin. An dip 150 in an acid such as fluoboric acid follows the second rinse to remove or prevent oxidation, following which tin 18 is electroplated on the microetched side by standard techniques in plating solution 160, preferably to a minimum thickness of 0.00005 inches. The sheet 16 is then rinsed a third time in a third water bath 170, dried (for example, in a hot air oven 180), and wound onto another reel 200.

What is claimed is:

1. A method for making a laminated circuit board having at least one access hole through which electrical contact to conductive traces may be made, comprising the steps of:
   (a) punching at least one access hole in a first coverfilm;
   (b) applying an adhesive system to a side of the first coverfilm;
   (c) laminating a copper sheet having a tin coating on one side to the adhesive-coated side of the first coverfilm, wherein the tin coated side of the copper sheet and the adhesive-coated side of the first coverfilm adhere to one another, thereby forming a laminate having a copper side and a first coverfilm side;
   (d) applying a protective coating over the copper side of the laminate in a pattern corresponding to a circuit, thereby leaving copper to be removed from the laminate exposed;
   (e) removing the exposed copper, thereby exposing the tin coating under the removed copper, and wherein the protected copper remains adhered to the first coverfilm; and
   (f) stripping the exposed tin coating.

2. The method of claim 1 further comprising an additional step of applying a protective coating over at least the remaining adhered copper.

3. The method of claim 2, wherein the first coverfilm has a thickness of between about 0.001 inch and about 0.005 inch.

4. The method of claim 2, wherein the first coverfilm comprises polyester and the adhesive system comprises a polyester-based adhesive.

5. The method of claim 2, wherein the first coverfilm comprises polyimid and the adhesive system comprises an acrylic-based adhesive.

6. The method of claim 2, wherein the adhesive system comprises an epoxy adhesive.

7. The method of claim 2, wherein the copper sheet is a sheet of between about 0.5 and about 5 ounces.

8. The method of claim 2, wherein the tin coating is between about 0.00005 inch and about 0.00150 inch thick.

9. The method of claim 8, wherein the tin coating is an electroplated coating.

10. The method of claim 2, wherein the laminating is performed with a hot roll nip laminator.

11. The method of claim 2, wherein the positive image applied by silkscreening a photoresistant, ultraviolet-curable resist onto the copper sheet.

12. The method of claim 11, wherein the resist is cured in a UV dryer.

13. The method of claim 2, wherein a positive image of the circuit is applied by applying a uniform layer of photoresistant material onto the copper sheet and exposing a portion of the uniform layer of photoresistant material to a light energy source having a wavelength selected to develop the photoresistant material, wherein the portion of the uniform layer is selected to cause the positive image of the circuit to remain after the photoresistant material is developed; and the photoresistant material is developed to cause the positive image to remain, thereby protecting the portions of the copper sheet where the positive image remains from removal.

14. The method of claim 2 wherein the exposed copper is removed by etching with an ammoniacal etchant.

15. The method of claim 2 wherein the protective coating is adapted to provide at least one access window to provide electrical access to at least a portion of the remaining adhered copper through the at least one access window.

16. The method of claim 15 wherein one of the at least one access windows at least partially overlaps one of the at least one access holes.

17. A method for making a double-sided circuit board having top side access comprising the steps of:
   (a) punching at least one access hole in a first coverfilm;
   (b) applying an adhesive system to a first and a second side of the coverfilm;
   (c) laminating a first copper sheet having a tin coating on one side to the first side of the coverfilm, the tin coating facing the first side of the coverfilm;
   (d) laminating a second copper sheet to the second side of the coverfilm;
   (e) applying a first protective coating over the first copper side of the resulting laminate in a first pattern corresponding to a first portion of a circuit, thereby dividing the surface into at least a first region of protected copper and at least a first region of exposed copper, wherein the at least a first region of exposed copper is to be removed;
   (f) applying a second protective coating over the second copper side of the laminate in a second pattern corresponding to a second portion of a circuit, thereby dividing the surface into at least a second region of protected copper and at least a second region of exposed copper, wherein the at least a second region of exposed copper is to be removed;
   (g) removing the at least a first region and the at least a second region of exposed copper, thereby exposing the tin coating under the first copper sheet where the at least a first region was removed, and leaving the at least a first region and the at least a second region of protected copper adhered to the laminate; and
   (h) stripping the exposed tin coating.

18. The method of claim 17 and further comprising an additional step of applying a protective coating over each of the first and second regions of adhered protected copper.

19. The method of claim 17 wherein the first coverfilm comprises a material selected from the group consisting of polyester and polyimid.

20. The method of claim 17 wherein the first coverfilm has a thickness of between about 0.001 inch and about 0.005 inch.

21. The method of claim 17 wherein the first coverfilm comprises polyester and the adhesive system comprises a polyester-based adhesive.

22. The method of claim 17 wherein the first coverfilm comprises polyimid and the adhesive system comprises an acrylic-based adhesive.

23. The method of claim 17 wherein the adhesive system comprises an epoxy adhesive.

24. The method of claim 17, wherein the first and second copper sheets are between about 0.5 and about 5 ounces.

25. The method of claim 17, wherein the tin coating is between about 0.00005 and 0.0015 inch thick.

26. The method of claim 25, wherein the tin coating is an electroplated coating.

27. The method of claim 17, wherein the laminating is performed with a hot roll nip laminator.

28. The method of claim 17 wherein the first and second positive images are applied by silkscreening a photoresistant, ultraviolet-curable resist onto the first and second copper sheets.

29. The method of claims 28, wherein the resist is cured in a UV dryer.

30. The method of claim 17, wherein positive images corresponding to the first and the second patterns are applied by applying respective first and second uniform layers of photoresistant material onto the first and second copper sheets and exposing portions of the first and second uniform layers to a light energy source having a wavelength selected to develop the photoresistant material, wherein the portions are selected to cause the positive images to remain after the photoresistant material is developed, and the photoresistant material is developed to cause the positive images to remain, thereby forming the first and the second protective coatings.

* * * * *